US012686004B2

(12) United States Patent

Marquardt et al.

(10) Patent No.: US 12,686,004 B2

(45) Date of Patent: Jul. 21, 2026

(54) AMPOULE FOR A SEMICONDUCTOR MANUFACTURING PRECURSOR

(71) Applicant: Applied Materials, Inc., Santa Clara, CA (US)

(72) Inventors: David Marquardt, Scottsdale, AZ (US); Jose Alexandro Romero, Scottsdale, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 652 days.

(21) Appl. No.: 18/087,434

(22) Filed: Dec. 22, 2022

(65) Prior Publication Data

US 2024/0207838 A1     Jun. 27, 2024

(51) Int. Cl.
    *B01L 3/12*        (2006.01)
    *C23C 16/448*     (2006.01)

(52) U.S. Cl.
    CPC ............ *B01L 3/12* (2013.01); *C23C 16/4482* (2013.01); *B01L 2300/0835* (2013.01); *B01L 2300/0883* (2013.01)

(58) Field of Classification Search
    CPC .............. B01L 3/12; B01L 2300/0835; B01L 2300/0883; C23C 16/4482; C23C 16/4481
    USPC ......................................................... 118/726
    See application file for complete search history.

(56) References Cited

U.S. PATENT DOCUMENTS

| | | | |
|---|---|---|---|
| 11,578,406 B2 * | 2/2023 | White ............... | H01L 21/67017 |
| 2005/0006799 A1 * | 1/2005 | Gregg .................. | C23C 16/4481 261/DIG. 65 |
| 2005/0066893 A1 * | 3/2005 | Soininen ............. | C23C 16/4482 118/715 |
| 2017/0342557 A1 * | 11/2017 | Baum .................. | C23C 16/4483 |
| 2022/0178020 A1 * | 6/2022 | White .................. | C23C 16/4481 |

\* cited by examiner

*Primary Examiner* — Rodney G Mcdonald

(74) *Attorney, Agent, or Firm* — Servilla Whitney LLC

(57) ABSTRACT

Ampoules for a semiconductor manufacturing precursors and methods of use are described. The ampoules include a container with an inlet port and an outlet port. The ampoules comprise an inlet plenum located between the inlet port and the cavity and an outlet plenum located between the outlet port and the cavity. A flow path is defined by a plurality of tubular walls and a flow ingress openings of the ampoule adjacent bottom edges of the tubular walls, through which a carrier gas flows in contact with the precursor.

20 Claims, 14 Drawing Sheets

AMPOULE FOR A SEMICONDUCTOR MANUFACTURING PRECURSOR

TECHNICAL FIELD

The present disclosure relates generally to ampoules for and methods of delivering semiconductor manufacturing precursors to semiconductor processing chambers. In particular embodiments, the disclosure relates to ampoules and methods to provide a tortuous flow path for low vapor pressure precursors.

BACKGROUND

The semiconductor industry is using an increasing variety of liquid and solid precursors, also referred to as "chemistries," for chemical vapor deposition (CVD) and atomic layer deposition (ALD) processes. The precursor or chemistry is typically inside a closed vessel or an ampoule with a single inlet and a single outlet, and the precursor is typically delivered to a semiconductor process chamber as a vapor using a carrier gas.

Precursors with a low vapor pressure typically utilize the carrier gas to carry the precursor vapor out of the ampoule to the semiconductor process chamber in vapor deposition processes. These types of processes typically use two types of ampoules: a bubbler in which the inlet carrier gas goes into a tube that is submerged into the precursor; and a cross-flow ampoule where the carrier gas sweeps headspace in the ampoule. Often, there is only a very short flow path for the carrier gas. The short flow path from the inlet to the outlet of the vessel does not allow adequate residence time within the vessel to allow the carrier gas to become fully saturated with vaporized or sublimed precursor. Some existing ampoule designs do not evenly distribute the carrier gas across the entire surface of the precursor. Some existing ampoules designs do not provide adequate heating of the precursor within the entire vessel. Many other solid source ampoules do not provide a means for keeping precursor dust from traveling downstream where it hampers control valve performance or creates on-wafer particle issues.

There is a need in the art for ampoules and methods of making and use, where the ampoule, in particular a cross-flow ampoule, has an adequate flow path to saturate or nearly saturate the carrier gas with the precursor and provide consistent delivery of the precursor.

SUMMARY

One or more embodiments are directed to an ampoule for semiconductor manufacturing precursors. The ampoule comprises a container defining a cavity configured to hold the precursor and bounded by sidewalls, a lid assembly and a bottom wall. An inlet port and an outlet port are both in fluid communication with the cavity. The ampoule includes an inlet plenum located between the inlet port and the cavity, and an outlet plenum located between the outlet port and the cavity. A plurality of elongate walls each having a top edge and a bottom edge defining a length and configured to contain the precursor, and the plurality of elongate walls are arranged to define flow channels. Each of the elongate walls comprises an ingress opening extending from the bottom edge. A flow path is defined by the flow channels and the flow ingress openings, through which a carrier gas flows in contact with the precursor.

Additional embodiments of the disclosure are directed to an ampoule for dispensing a vapor mixture of a carrier gas and a precursor such as a low vapor pressure precursor used in semiconductor manufacturing. The ampoule comprises a container having a bottom wall, sidewalls, and a lid assembly, the container defining a cavity configured to hold the precursor, such that a height (H) of the cavity spans from a lower surface of the lid assembly to a top surface of the bottom wall. A single inlet port and a single outlet port are both in fluid communication with the cavity. The ampoule includes an inlet plenum located between the inlet port and the cavity, and an outlet plenum located between the outlet port and the cavity. A plurality of elongate tubular walls are configured to contain the precursor and arranged to define flow channels, each of the elongate walls having a top edge and a bottom edge defining a length and arranged to define flow channels, each of the elongate walls comprising a flow ingress opening extending from the bottom edge, the flow ingress openings being offset such that not one ingress opening overlaps with another ingress opening. A tortuous flow path defined by the flow channels and the flow ingress openings, through which a carrier gas flows in contact with the precursor.

Further embodiments of the disclosure are directed to methods of providing a flow of precursor in a substrate processing chamber during a vapor deposition process to form a film on a substrate. The method comprises flowing a carrier gas through an inlet port and an inlet plenum of an ampoule having a low vapor pressure precursor therein. The flow of carrier gas is directed within the ampoule and in contact with the precursor through a flow path defined by a plurality of elongate walls having a top edge and a bottom edge and flow ingress openings in each of the elongate walls, through which a carrier gas flows in contact with the precursor, the flow ingress openings extending from a bottom edge of each of the plurality elongate walls. The carrier gas and precursor flow out of the ampoule through an outlet plenum and an outlet port into the substrate processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
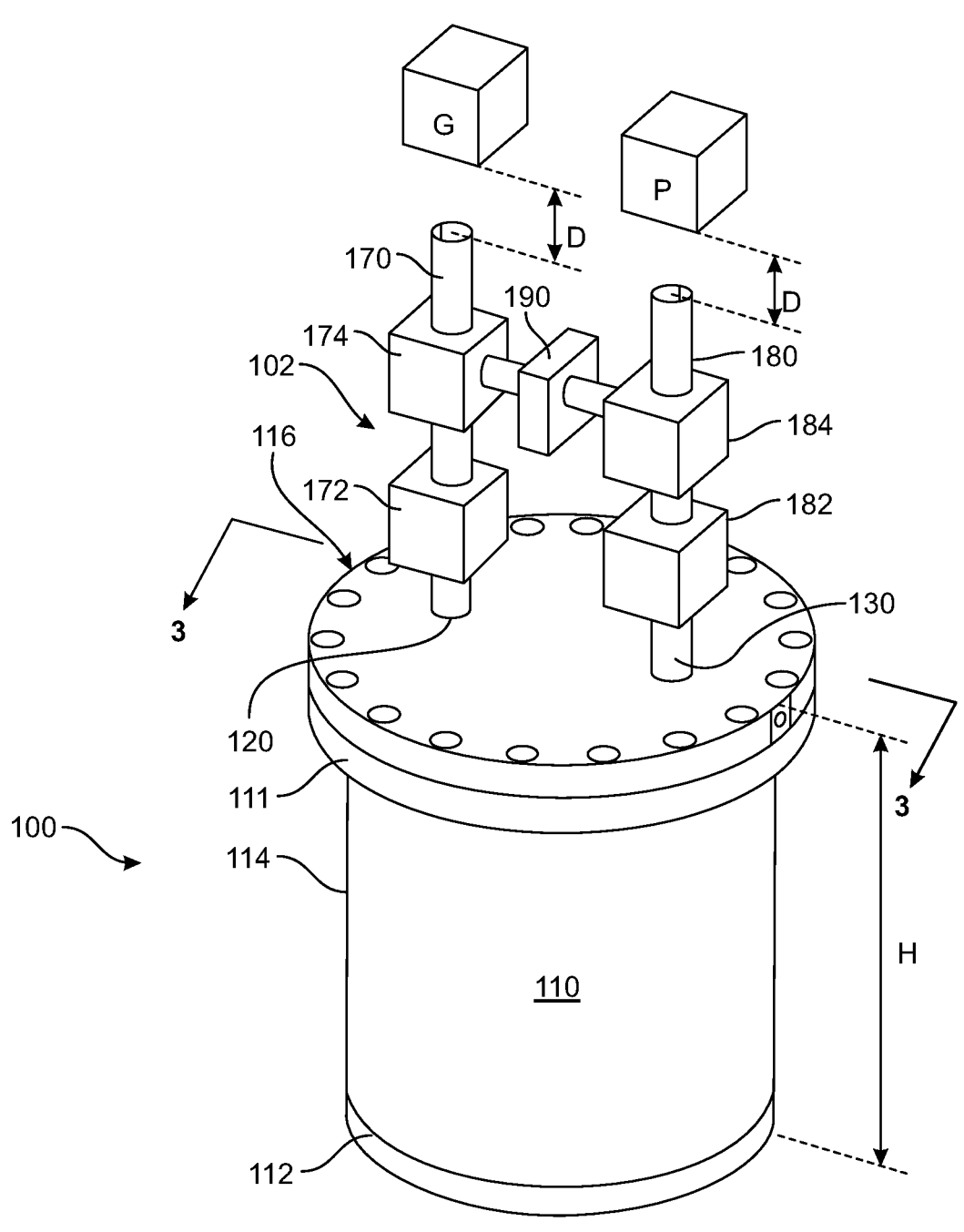
FIG. 1A is an isometric view of an ampoule and an accompanying manifold having an "outer-to-inner flow" configuration in accordance with an embodiment.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatched shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The claimed ampoules and methods are capable of other embodiments and of being practiced or being carried out in various ways.

Some embodiments of the disclosure advantageously provide a long flow path for a carrier gas from ampoule inlet to outlet for the delivery of low vapor pressure precursors, e.g., liquid and/or solid source precursor. Low vapor pressure precursors are understood to refer to materials that do not readily vaporize under atmospheric conditions. Low vapor pressure precursors typically have a vapor pressure of less than 10 Torr, and more typically less than 1 Torr. In some applications, a carrier gas is used to deliver low vapor pressure material from an ampoule to a reactor. Low vapor pressure materials typically require heat to increase the vapor pressure. A non-limiting list of exemplary precursors includes $ZrCl_4$, $Y(EtCP)_3$, $HfCl_4$, $WCl_5$, $MoCl_5$, $In(CH_3)_3$, and liquid indium hafnium.

A long flow path within an ampoule containing a precursor allows the carrier gas adequate residence time to become partially to nearly to fully saturated with vaporized and/or sublimed and/or entrained precursor that is carrier by a carrier gas flowing through the ampoule. Reference herein to "saturated" allows for varying degrees of saturation.

Embodiments herein also provide ways for heating low vapor pressure precursors in large volume ampoules, including ways to provide effective uniform heating of the precursors. Some specific embodiments advantageously retain low vapor pressure precursors, including solid precursor dust, within a cavity of the vessel, not allowing it to migrate upstream or downstream to control valves. Some embodiments advantageously control uneven depletion of the precursor. Some embodiments advantageously provide even distribution of the carrier gas along the entire surface of the precursor. Embodiments herein provide improved doses of the precursor to substrate processing chambers, for example, atomic layer deposition chambers and chemical vapor deposition chambers that are used to deposit layers formed from precursors onto substrates, such as semiconductor substrates and other substrates used in microelectronic manufacturing. Designs provided herein may offer a high capacity (volume) ampoule in a smaller footprint than other designs. Designs herein are easy to clean and be refilled. Designs herein can contain precursor charges (i.e., amounts of precursor) of up to 10-20 kilograms.

In some embodiments, the ampoules contain a plurality of elongate walls defining a labyrinth such that the flow path is tortuous. Advantageously, one or more embodiments provide a flow path whose distance can be five to ten times longer than distances found with common ampoules, in particular solid source sublimation vessels. In one or more embodiments, the wall defining the labyrinth are formed from a solid material such as a metal that is not porous, and the flow of gas through the tortuous path occurs only through flow ingress openings formed in the walls, and not through the body of the walls.

Generally, according to one or more embodiments, an ampoule comprises a container defining a cavity configured to hold and contain a precursor; an inlet port and an outlet port, both in fluid communication with the cavity; an inlet plenum and an outlet plenum, each located between the respective inlet or outlet port and the cavity; and a plurality of elongate walls containing the precursor arranged to define flow channels, each of the elongate walls comprising a flow ingress opening. The walls are solid and not porous, except for the flow ingress openings. A flow path is defined by the flow channels and the flow ingress openings, through which a carrier gas flows in contact with the precursor. In one or more embodiments, the flow path travels from an outermost channel to an innermost channel, which may be referred to as an "outer-to-inner flow" configuration. In one or more embodiments, the flow path travels from an innermost channel to an outermost channel, which may be referred to as an "inner-to-outer flow" configuration.

Generally, the flow paths provided herein force the carrier gas to flow around a series of elongate walls, which in one or more particular embodiments are nested concentric tubes, which define flow channels, each containing a volume of solid precursor. The gas flow changes direction from flow channel to flow channel until the last flow channel in communication with the outlet port is reached. This change of direction also enhances mixing of the vaporized and/or sublimed precursor with the carrier gas. Ingress openings allow the carrier gas to flow through into the next flow channel. Reference herein to gas flow includes the carrier gas alone or in combination with entrained and/or vaporized and/or sublimed precursor. The flow paths described herein, for example, with respect to FIGS. 3A, 4 or FIG. 10A, it is understood that a series of elongate walls, tubular or otherwise, with ingress openings configured to define flow channels therebetween will result in a desired flow path. Preferably, the flow ingress openings are offset to ensure no flow channels are bypassed.

FIG. 1A shows a schematic view of an ampoule and accompanying manifold having an "outer-to-inner flow" configuration in accordance with an embodiment. An ampoule 100 and a manifold 102 are suitable for use with semiconductor manufacturing raw materials, which include reagents and precursors. The term "precursor" is used to describe the contents of the ampoule 100 and refers to any reagent that flows into a process environment.

The ampoule 100 includes a container 110 with a bottom wall 112, sidewalls 114, and a lid assembly 116 including a lid 115. An inlet port 120 and outlet port 130 are in fluid communication with a cavity defined by internal walls of the container 110. The inlet port 120 is generally configured to allow a connection to a gas source "G" by way of suitable piping and valve(s) and may have suitable threaded or sealing connections. In one or more embodiments, the gas source "G" is a carrier gas; in one or more embodiments, the carrier gas is inert. The outlet port 130 is also in fluid communication with the cavity. The outlet port 130 is generally configured to be able to connect to a line, including suitable piping and valve(s), to allow the flow of gases, which may include entrained particles, exiting the container 110 to flow to a processing chamber (or other component) "P". The outlet port 130 may have a welded or threaded connection to allow a gas line to be connected. A height (H) of the cavity defined by the container 110 spans from a lower surface 116a of the lid assembly 116 to a top surface 112a of the bottom wall 112.

Figure 2:
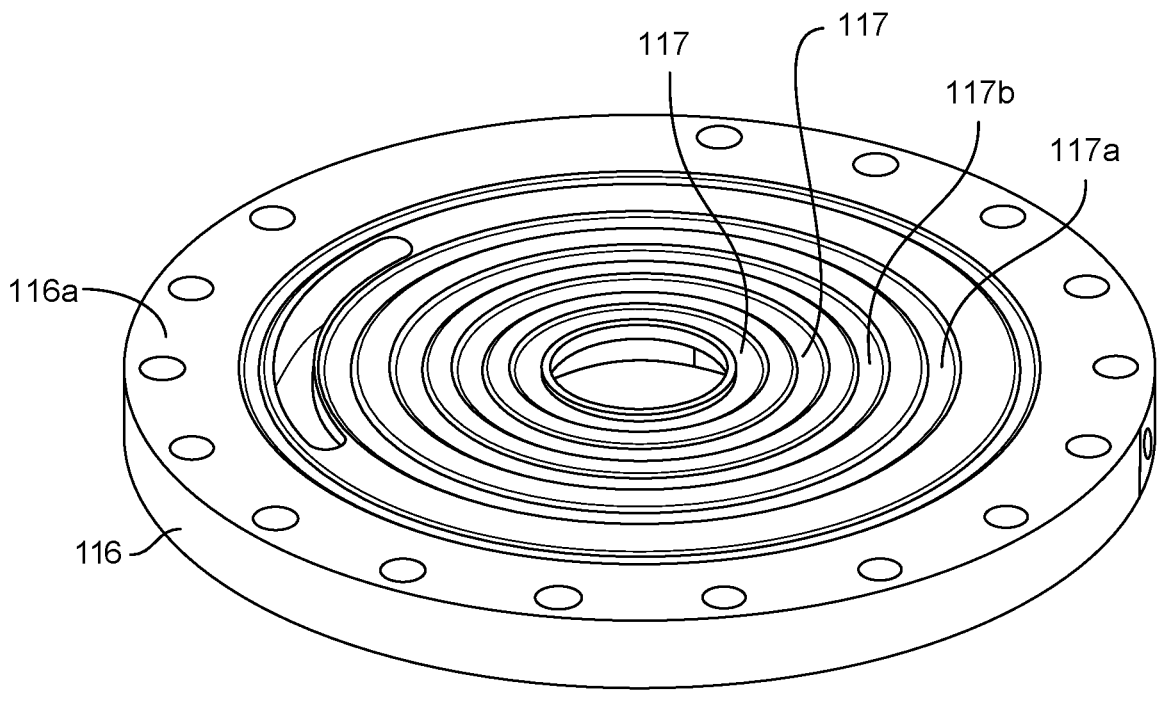
FIG. 2 is an isometric view of a lid of an ampoule according to an embodiment.
Figure 3A:
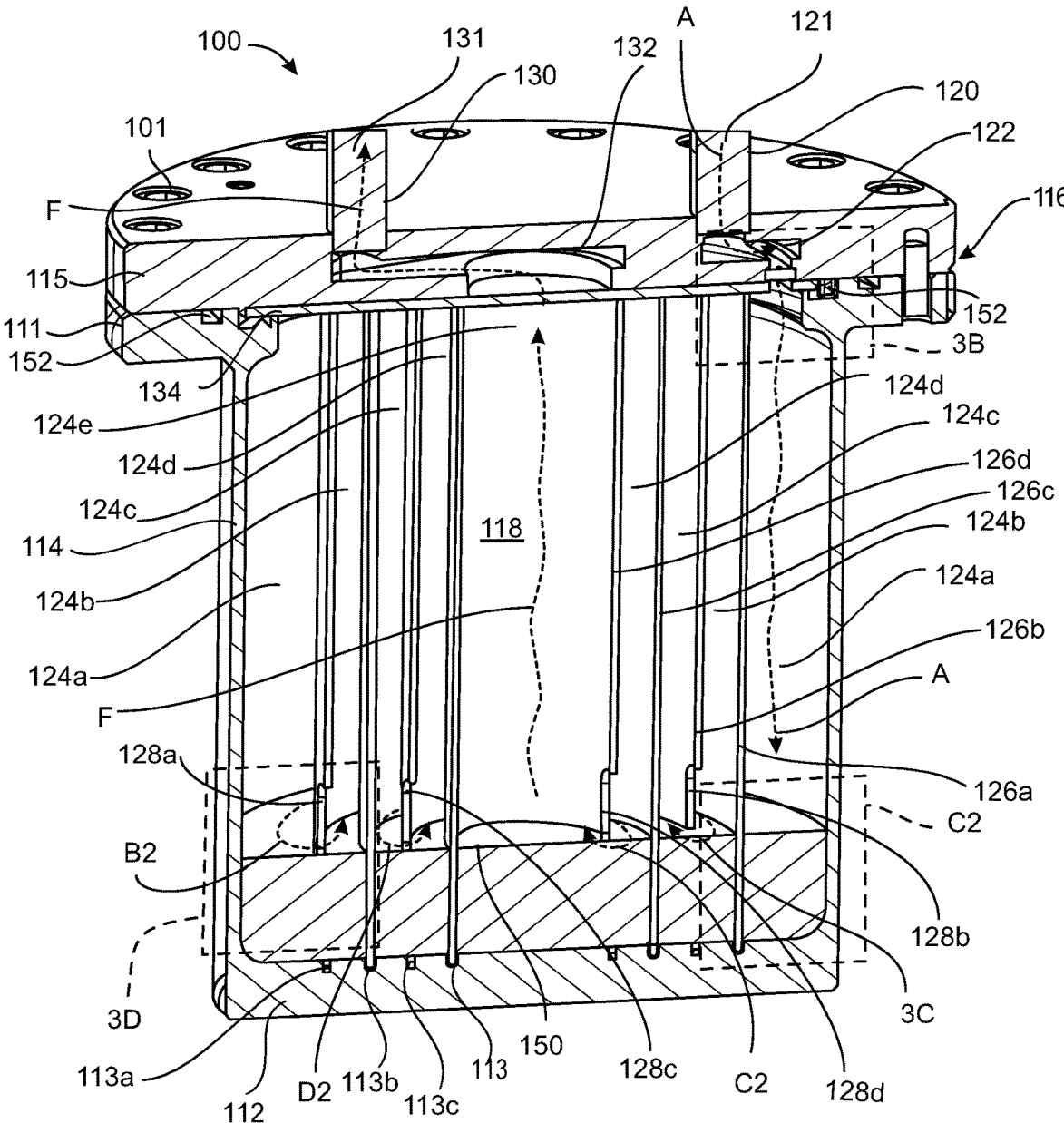
FIG. 3A is a cross-sectional view of FIG. 1A taken along line 3-3 of FIG. 1A according to one or more embodiments.

Turning to FIG. 2, shows a schematic view of a bottom wall of an ampoule of an embodiment, and FIG. 3A, which shows a cross-section view of FIG. 1A, the ampoule comprises a single inlet port 120 and a single outlet port 130. While the embodiment of FIG. 3A depicts one of each an inlet and an outlet port, should a particular application require, multiple inlet ports and outlet ports may be present. Positioning of the inlet and outlet ports may be switched to accommodate other designs.

The inlet port 120 has a passage 121 with an inner diameter defining a cross-sectional width of the passage 121 that extends into a portion of a depth of the lid assembly 116. The passage 121 is in fluid communication with an inlet port plenum 122. The inlet port plenum 122 is designed to accommodate a volume of incoming carrier gas from a source "G", which in turn flows into the cavity—generally the cavity is shown as 118. The inlet port plenum 122 is sized so as to not restrict flow of incoming carrier gas. The inlet port plenum 122 may be positioned and or sized to accommodate incoming flow lines.

The outlet port 130 has a passage 131 with an inner diameter defining a cross-sectional width of the passage 131 that extends into a portion of a depth of the lid assembly 116. The passage 131 is in fluid communication with an outlet port plenum 132. The outlet port plenum 132 is designed to accommodate a volume of outgoing entrained and/or saturated carrier gas, which in turn flows out of the ampoule to a downstream process chamber "P". The outlet port plenum 132 is sized so as to not restrict flow of outgoing entrained and/or saturated carrier gas. The outlet port plenum 132 may be positioned and or sized to accommodate outgoing flow lines.

With specific regard to this embodiment, the cavity 118 is made up of a plurality of flow channels 124a-124e defined by a plurality of elongate walls 126a-126d. The elongate walls 126a-126d each comprise a flow ingress opening as follows: ingress opening 128a of the elongate wall 126a, ingress opening 128b of the elongate wall 126b, ingress opening 128c of the elongate wall 126c, and ingress opening 128d of the elongate wall 126d. The flow ingress openings are offset such that not one ingress opening overlaps with another ingress opening.

With reference to FIGS. 2 and 3A, in this embodiment, the plurality of elongate walls 126a-126d at a bottom edge or rim reside in or mate with corresponding grooves 117a-117d in a lower surface 116a of the lid assembly 116. A plurality of grooves 113a-d aligned with the grooves 117a-117d are optionally present in a lower surface of the bottom wall 112. In one or more embodiments, in an absence of the distribution element 134, the plurality of elongate walls 126a-126d at the top edge or rim can reside in or mate with the plurality of grooves optionally present in a lower surface of the lid assembly 116. The elongate walls 126a-126d span the height of the cavity extending into the bottom wall 112 and towards, and optionally into, the lid 115. The elongate walls 126a-126d are effective to conduct heat from one or more external heat sources. In embodiments, the elongate walls are solid and are non-porous, permitting gas to flow through the elongate walls 126a-126d at the ingress openings.

A distribution element 134 is optionally present, sandwiched between the lid assembly 116 and top edges of the elongate walls. The distribution element 134 is located between the cavity 118 and both the inlet and outlet plenums, 122 and 132, respectively. That is, flow exiting the inlet port plenum 122 passes through the distribution element 134 prior to entering the cavity 118, and flow exiting the cavity 118 passes through the distribution element 134 prior to entering the outlet plenum 132. Thus, the distribution element extends across the width or diameter of the container and covers the top surfaces of the walls 126a-d.

The distribution element 134 may be any suitable material or configuration or dimensions or media grade offering one or more of the following characteristics: withstands long-term exposure to the precursor, does not introducing a pressure drop that would impede effective delivery of the precursor, pore size to inhibit and/or prevent fine particles and/or droplets of precursor from exiting the ampoule to protect both the inlet and outlet equipment, and pliable to be capable of making a slight seal between ends of the elongate walls and an inner diameter of the cavity. In one or more embodiments, the distribution element 134 is a porous disk of filter media. In one or more embodiments, the distribution element is a sintered, porous stainless steel material. A non-limiting, exemplary porosity of the distribution element 134 may be greater than or equal to 0.1 micrometers to less than 100 micrometers, and all values and subranges therebetween, as measured by average pore size. In some embodiments, there may be a shim between a lower surface of the distribution element 134 and top edges of the elongate walls.

In some embodiments, the ampoule 100 includes a precursor 150, which in some embodiments is a low vapor pressure material within the cavity 118, residing in the flow channels defined by the elongate walls 126a-126d. Space above the material within the cavity 118 and below the lower surface 116a of the lid assembly is referred to as the head space of the ampoule 100. When present, the distribution element 134 resides in the head space of the ampoule. The precursor 150 can be a precursor for use with a semiconductor manufacturing process. In one or more embodiments, the material with a low vapor pressure is a liquid. In other embodiments, the material with a low vapor pressure is a solid.

In some embodiments, as shown in FIG. 3A, the lid assembly 116 is a separate component from the bottom wall 112 and sidewalls 114. The lid assembly 116 can be connected to the sidewalls 114 of the container 110 using removable bolts through appropriately shaped openings, which may have a threaded portion to allow for easy connection of a threaded bolt. The bolts can be removed to allow the lid assembly 116 to be removed from the container 110 so that the precursor 150 in the container 110 can be changed or added.

The lid may further comprise one or more external surface features to reciprocate with an external heater. The bottom wall may be configured to reciprocate with an external heater. One or more jacket heaters may be provided around the sidewalls.

A first seal 152 is located between an upper surface of the sidewalls 114 and the lower surface 116a of the lid assembly 116 to form a fluid tight seal. In embodiments in which the bottom wall 112 is a separately formed element, a second seal is located between an upper portion of the bottom wall 112 and a lower surface of the sidewalls 114 to form a fluid tight seal. In the embodiment shown in FIG. 3A, the bottom wall 112 is integrally formed with the sidewalls 114, eliminating the need for a second seal. In some embodiments where the bottom wall 112 is a separately formed element, the first seal 152 and the second seal are independently an O-ring. In some embodiments (not shown), the lid assembly 116 can be integrally formed with the sidewalls 114 and the bottom wall 112 of the container 110.

Different manifold configurations can be connected to the lid assembly 116 to allow the ampoule 100 to be added to a process chamber. In some embodiments, an inlet line 170 is connected to the inlet port 120. An inlet valve 172 can be positioned on the inlet line 170 between gas source "G" and the inlet port 120. The inlet valve 172 can be integrally formed with the lid assembly 116 or connected to the lid assembly 116 as a separate component. An outlet line 180 can be connected to the outlet port 130. The outlet line 180 of some embodiments includes an outlet valve 182 located between the outlet port 130 and the processing chamber "P". The inlet valve 172 and outlet valve 182 can be used to isolate the ampoule 100 so that the contents of the cavity 118 are isolated from the environment outside of the container 110. In some embodiments, there are multiple valves along the inlet line 170 (e.g., 174) and/or the outlet line 180 (e.g., 184) and/or therebetween (e.g., 190). The valves can be manual valves or pneumatic valves.

Figure 4:
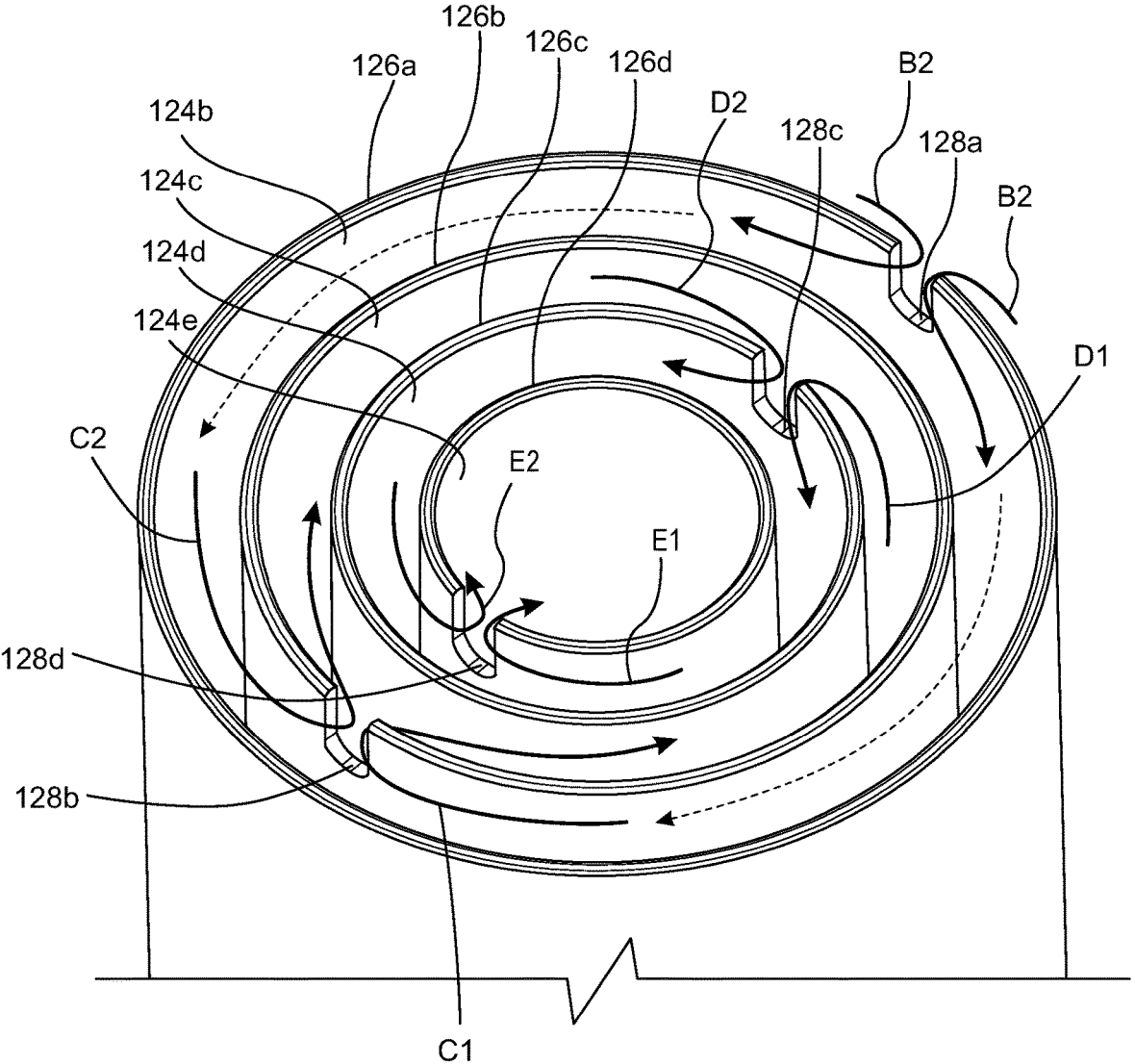
FIG. 4 is a bottom perspective view of tubular walls of an ampoule according to FIGS. 1A and 3A showing an annotation of flow of vapor in accordance with one or more embodiments.

FIG. 4 shows a bottom perspective view of elongate walls 126a-126d of an ampoule with annotation of flow in accordance with one or more embodiments. In one or more embodiments, the elongate walls 126a-126d comprise elongate tubular walls, which define a series of flow channels 124a-124e. As depicted in FIG. 3A, in one or more embodiments, the elongate walls 126a-126d are concentric and tubular. The relative location of the walls may be adjusted to, for example, favor depletion of the precursor in a desired matter. In one or more embodiments, annular distances between walls varies. The use of tubular elongate walls, fabricated by nesting readily available tubing facilitates assembly and reduces costs of the ampoules.

Carrier gas flow enters the ampoule 100 from the inlet port 120 by way of the inlet port plenum 122, as discussed with respect to FIG. 3A. The carrier gas, indicated by dashed arrow "A" in FIG. 3A, enters the flow channel 124a defined by the sidewalls 114 and the elongate wall 126a and contacts the precursor 150 at a high velocity after passing through the orifice 162, thereby entraining and/or vaporizing the precursor as the carrier gas passes over a surface of a volume of the precursor. Flow then proceeds through ingress opening 128a of elongate wall 126a, at which point the carrier gas enters flow channel 124b and the surface of elongate wall 126b opposite the flow ingress opening 128a directs the flow in two directions, depicted by arrows B1 and B2 through the flow channel 124b. While in flow channel 124b, the carrier gas continues to contact the precursor 150 and become saturated. Similarly, flow then proceeds through ingress opening 128b of elongate wall 126b, at which point the carrier gas enters flow channel 124c and the surface of elongate wall 126c directs the flow in two directions, depicted by arrows C1 and C2 through the flow channel 124c. While in flow channel 124c, the carrier gas continues to contact the precursor 150 and become saturated. Likewise, flow then proceeds through ingress opening 128c of elongate wall 126c, at which point the carrier gas enters flow channel 124d and the surface of elongate wall 126d directs the flow in two directions, depicted by arrows D1 and D2 through the flow channel 124d. While in flow channel 124d, the carrier gas continues to contact the precursor 150 and become saturated. Finally, flow then proceeds through ingress opening 128d of elongate wall 126d, at which point the carrier gas enters flow channel 124e, depicted by dashed arrow F in FIG. 3A and depicted by arrows E1 and E2 in FIG. 4, and out of the ampoule through outlet plenum 132 and outlet port 130. While in flow channel 124e, the carrier gas continues to contact the precursor 150 and become saturated.

Accordingly, the flow channels 124a-124e are nested comprising a plurality of tortuous passages (124a, 124b, 124c, 124d) and an outlet channel or passage (124e), such that with respect to the tortuous passages, flow through a first ingress opening (128a, 128b, 128c) diverts the carrier gas into first and second portions each flowing in first and second directions (e.g., B1 and B2, C1 and C2, and D1 and D2) through first and second sections of the tortuous passages, respectively.

Figure 1B:
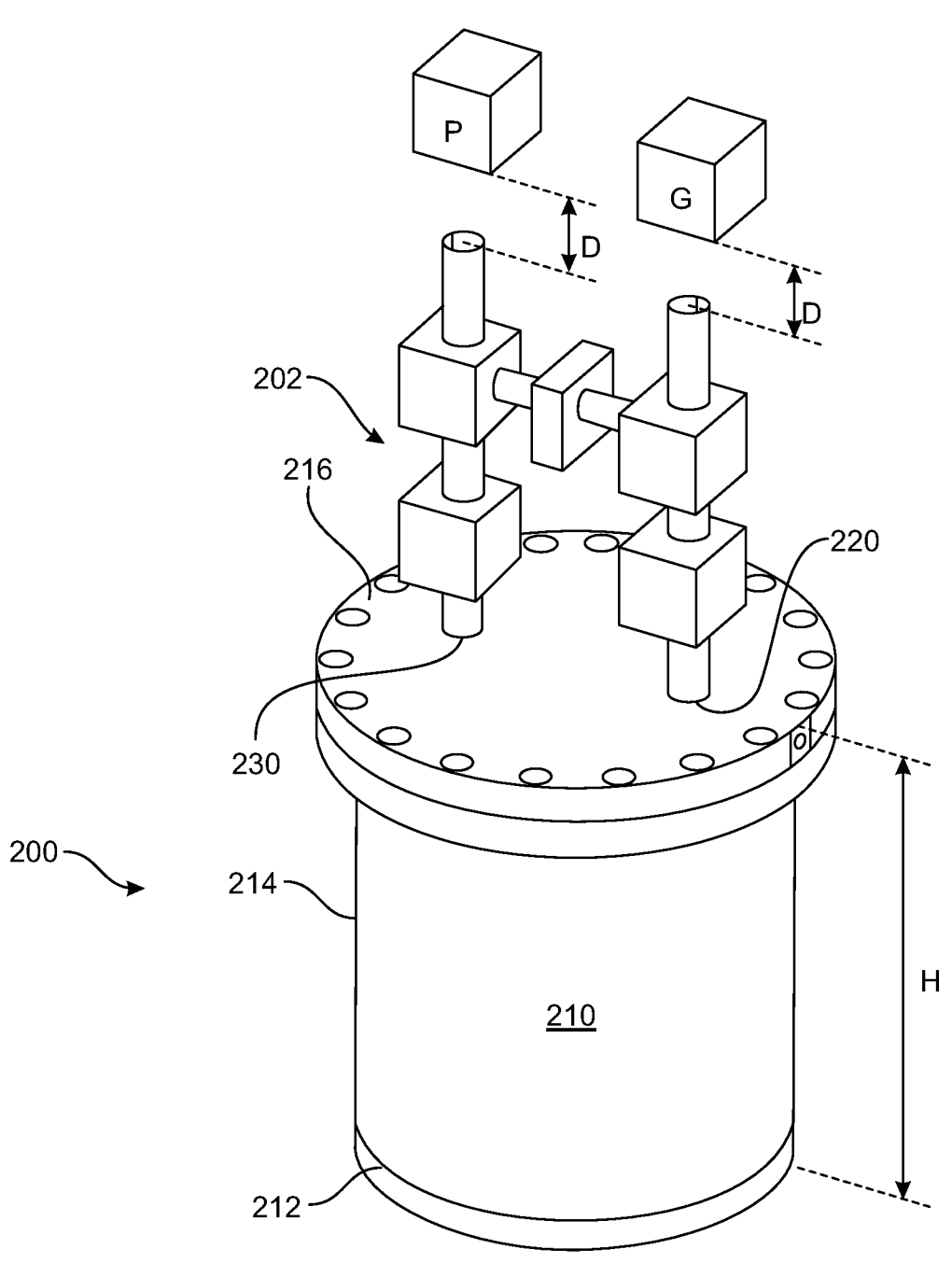
FIG. 1B is an isometric view of an ampoule and an accompanying manifold having an "inner-to-outer flow" configuration in accordance with another embodiment.

FIG. 1B shows a schematic view of an ampoule and accompanying manifold having an "inner-to-outer flow" configuration in accordance with an embodiment. An ampoule 200 and a manifold 202 are suitable for use with semiconductor manufacturing raw materials, which include reagents and precursors. The term "precursor" is used to describe the contents of the ampoule 200 and refers to any reagent that flows into a process environment.

The ampoule 200 includes a container 210 with a bottom wall 212, sidewalls 214, and a lid assembly 216. An inlet port 220 and outlet port 230 are in fluid communication with a cavity defined by internal walls of the container 210. The inlet port 220 is generally configured to allow a connection to a gas source "G" by way of suitable piping and valve(s) and may have suitable threaded or sealing connections. In one or more embodiments, the gas source "G" is a carrier gas; in one or more embodiments, the carrier gas is inert. The outlet port 230 is also in fluid communication with the cavity. The outlet port 230 is generally configured to be able to connect to a line, including suitable piping and valve(s), to allow the flow of gases, which may include entrained particles, exiting the container 210 to flow to a processing chamber (or other component) "P". The outlet port 230 may have a welded or threaded connection to allow a gas line to be connected. A height (H) of the cavity defined by the container 210 spans from a lower surface 116a of the lid assembly 216 to a top surface of the bottom wall 212.

It will be appreciated that the flow of gas and precursor entrained in carrier gas through the embodiment shown in FIG. 1B is essentially reversed when compared to the embodiment shown and discussed above with respect to FIGS. 3A and 4. Thus, the flow is from the center of the ampoule and the direction of flow is reversed in FIG. 4 at arrows E1 and E2, where the gas flows to flow channel 124d, out to flow channel 124c at arrows D1 and D2 in the reverse direction shown in FIG. 4, and then out to flow channel 124b at arrows C1 and C2 where the flow is in the reverse direction shown in FIG. 4, and then out through opening 128a in the reverse direction of arrows B1 and B2 shown in FIG. 4. The precursor entrained in the gas then flows to the outlet port 230 and to a processing chamber P as shown in FIG. 1B.

According to one or more embodiments, the flow ingress openings of any embodiment are suitable to allow carrier gas to flow from one flow channel to another. The flow ingress openings may take any suitable shape and/or configuration and/or location along the elongate walls to accommodate flow of entrained and/or saturated carrier gas. The flow ingress openings may span a full length of the container, or varying lengths. Features of the flow ingress openings could be a plurality of holes, tapered slots, or other shapes. In one or more embodiments, the flow ingress openings are sized and shaped to provide a varying conductance of carrier gas along a longitudinal distance of the container. In one or more embodiments, the flow ingress opening(s) increase in size in order to increase conductance from the lid assembly toward the bottom wall of the ampoule.

Figure 5:
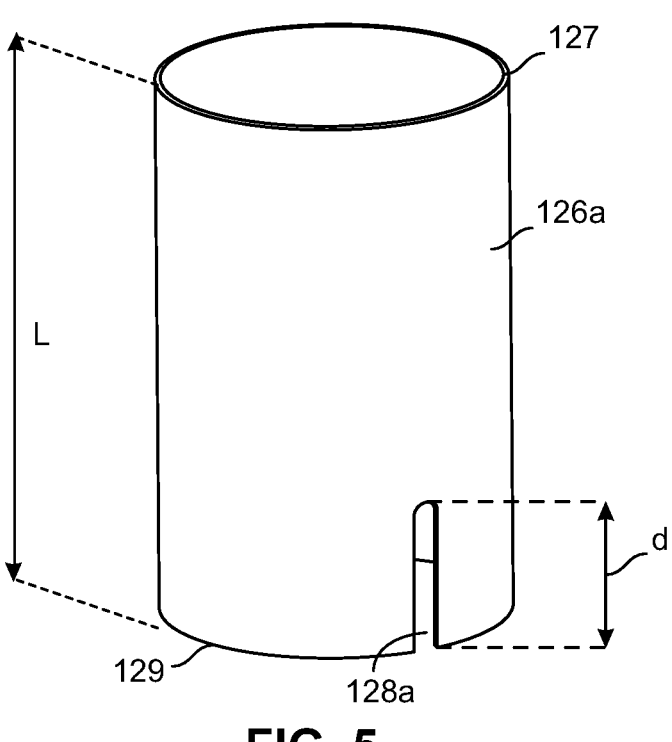
FIG. 5 is an isometric view of a tubular wall in accordance with an embodiment of the disclosure.
Figure 6:
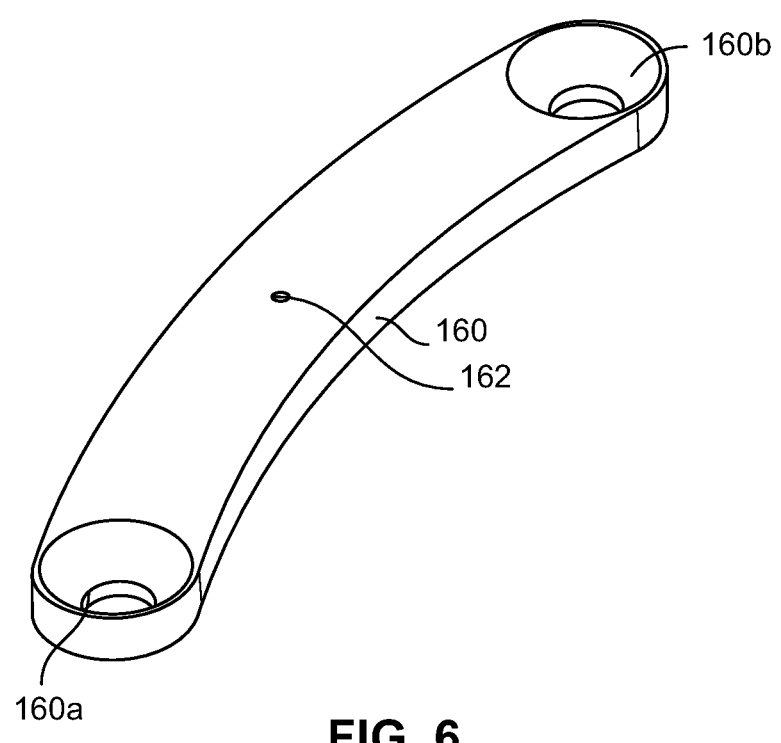
FIG. 6 is a perspective view of a filter insert including an orifice in the ampoule according to FIG. 1A and FIG. 3A in accordance with one or more embodiments.

Referring now to FIG. 5, an isometric view of a tubular wall 126a, representative of each of the tubular walls 126a-d) is shown in accordance with an embodiment of the disclosure. The tubular walls 126a-d, each have a top edge 127 and a bottom edge 129 defining a length L and configured to contain the precursor, the plurality of elongate walls arranged to define flow channels, each of the elongate walls comprising a flow ingress opening 128a having a dimension d that defines the longitudinal distance of flow ingress opening 128a from the bottom edge 129 to the top of the ingress opening 128a.

In one or more embodiments, the flow ingress openings are notches located at a bottom end of the elongate walls near the lid assembly. In one or more embodiments, each of the flow ingress openings spans a longitudinal distance d of greater than or equal to 1-5%, 1-10%, 1-20%, 1-30%, 1-40%, 1-50%, 5-10%, 5-20%, 10-20%, 5-30%, 10-30%, 15-30%, 5-40%, 10-40%, 20-40%, 5-50%, 10-50%, or 25-50% to less than or equal to 100% of a length L of the tubular wall 126a, including all values and subranges therebetween.

In one or more embodiments, the flow ingress openings are a plurality of holes on each wall spaced apart along a length of each wall. In one or more embodiments, the plurality of holes spaced apart along a length of each wall increase in size from a lid-end edge to a bottom wall edge. In some embodiments, the flow ingress openings are in the form of a rectangular or substantially rectangular passage at the bottom of each tubular wall. Substantially rectangular refers to the transitions from horizontal to vertical edges of the flow ingress openings not necessarily being right angle or straight lines, but may be curved. Simulations with the flow ingress openings at the bottom edge 129 of the tubular walls showed average efficiency improvement of +50%, as high as 70% for some precursors compared to when the flow ingress openings were located adjacent the top edge 127.

Figures 3B, 3C, 3D:
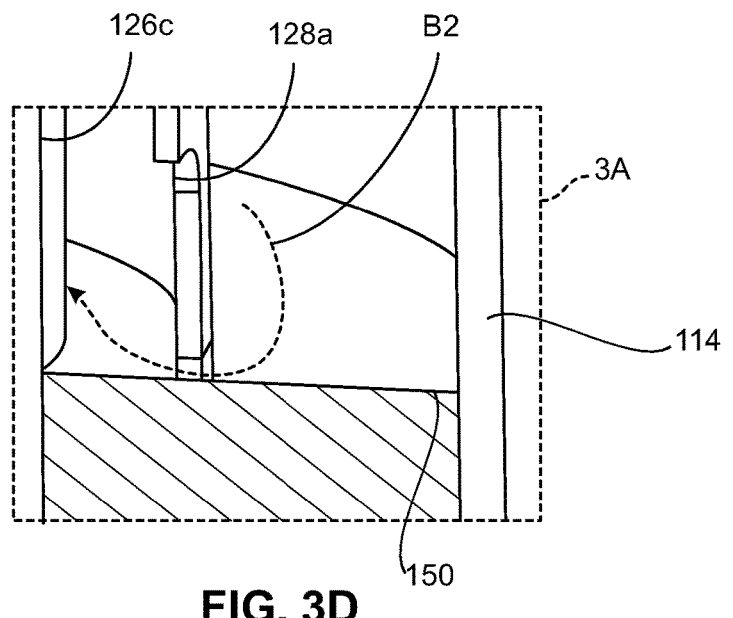
FIG. 3B is a partial cross-sectional view of section 3B in FIG. 3A.
FIG. 3C is a partial cross-sectional view of section 3C in FIG. 3A.
FIG. 3D is a partial cross-sectional view of section 3D in FIG. 3A.
Figure 7A:
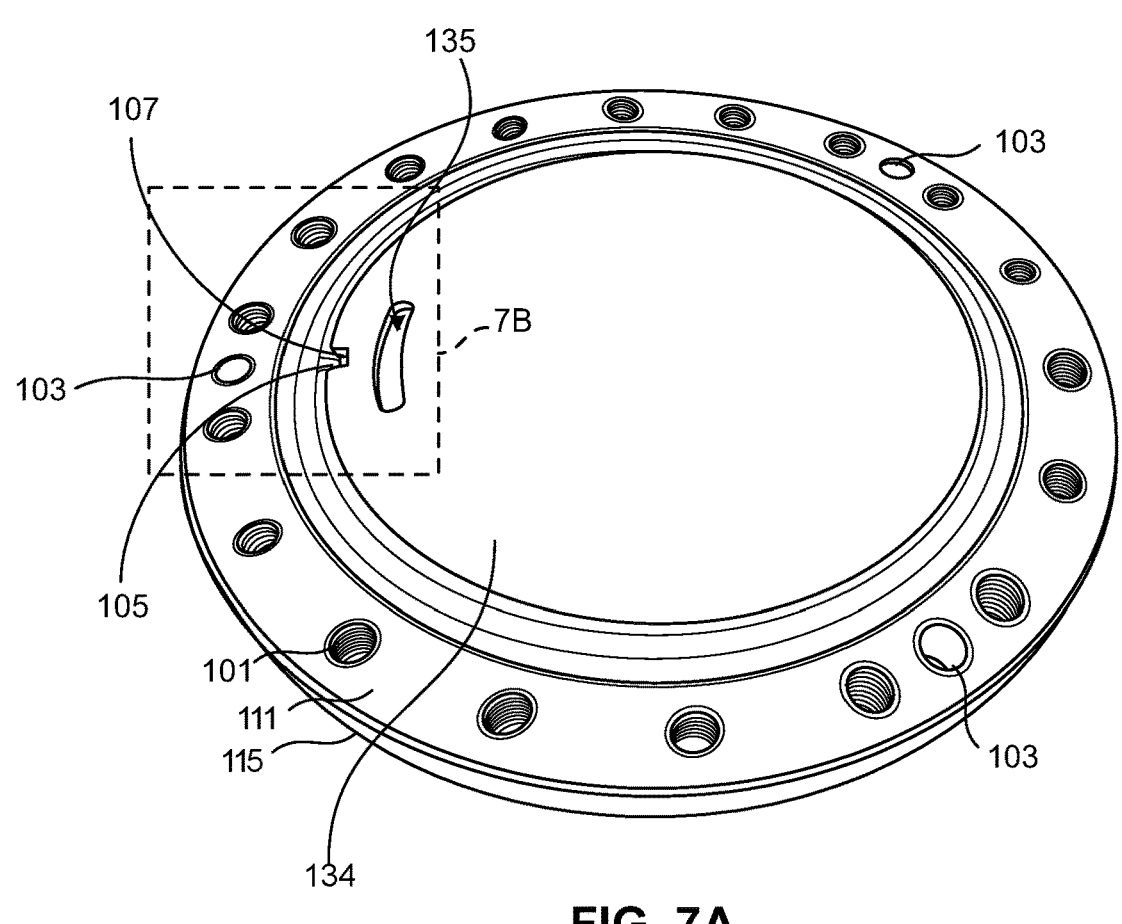
FIG. 7A is a perspective view of a filter mounted within the flange of the bottom side of the ampoule according to FIG. 1A and FIG. 3A in accordance with one or more embodiments.
Figure 7B:
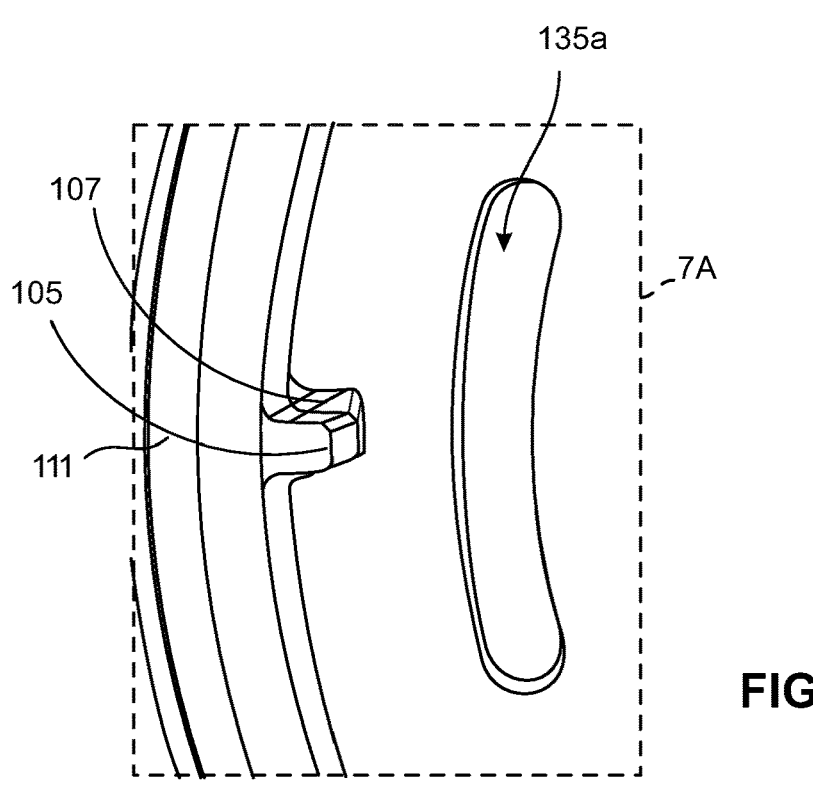
FIG. 7B is a partial section view of section 7B of FIG. 7A.
Figure 8:
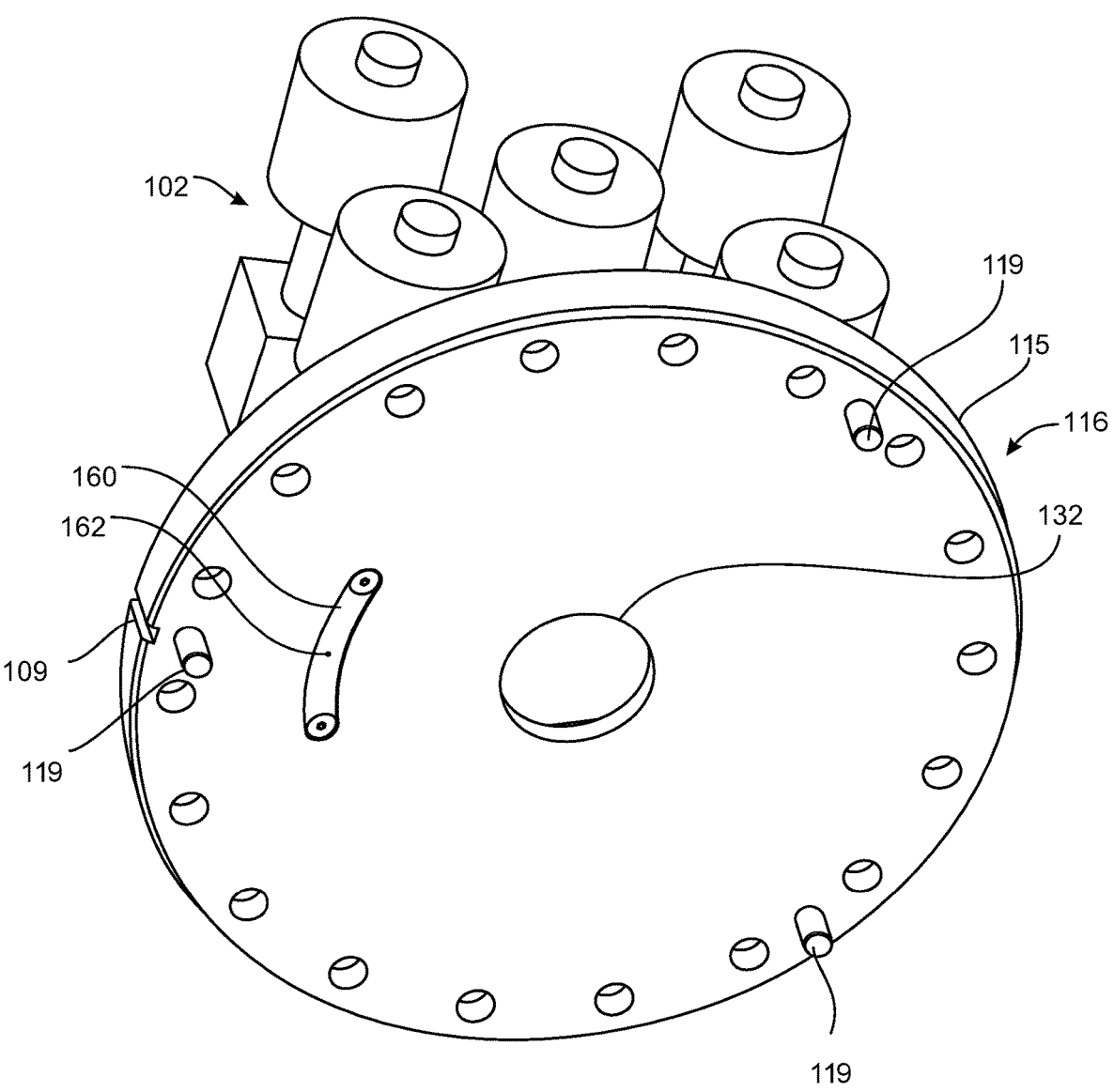
FIG. 8 is a bottom perspective view of a lid assembly of an ampoule in accordance with an embodiment.
Figure 9:
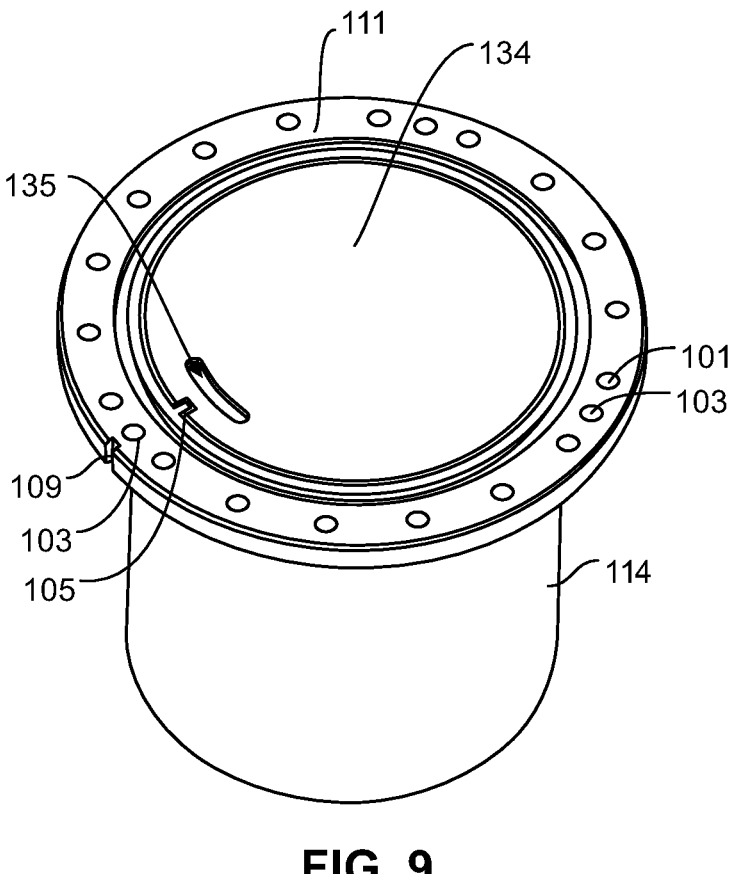
FIG. 9 is a perspective view of an ampoule and sheet configured for use with the lid assembly shown in FIG. 8.

Referring now to FIG. 6, FIG. 7A, FIG. 7B, FIG. 8 and FIG. 9, embodiments of the disclosure comprise gas distribution insert 160 that is inserted into a receptacle 135 or opening in the distribution element 134. The gas distribution insert 160 comprises an orifice 162 therethrough, the orifice 162 sized and configured to increase the flow velocity of gas flowing into the ampoule. In one or more embodiments, there is a single orifice 162, but there can be any number of orifices, for example, one to twenty or one to six orifices, each orifice having a diameter in a range of from 0.01 mm to 10 mm, 0.01 to 1 mm, 0.2 mm to 0.9 mm, 0.2 to 0.8 mm, 0.3 mm to 0.7 mm to increase flow velocity of the carrier gas entering the ampoule. The gas distribution insert 160 may further comprise fastener openings 160a and 160b to permit the insert 160 to be fastened to the distribution element 134 or otherwise fastened to the lid assembly 116, as shown in FIG. 3B and FIG. 8, where the gas distribution insert 160 is fastened to the lid 115 at receptacle 135a.

The lid 115 includes a peripheral rim 111 including that has a plurality of threaded openings 101 to receive fasteners such as bolts or other suitable fasteners to secure the lid 115 to the container 110. In addition, the peripheral rim 111 comprises pin receptacles 103 that are configured to receive complementary pins 119 extending from the peripheral rim 111. The peripheral rim 111 includes an inward protrusion 105 that aligns with and engages a notch 107 in the distribution element 134. The peripheral rim 111 further includes an external notch 109, which may further aid in alignment of the distribution element 134 and the peripheral rim 111. FIG. 7B shows a complementary receptable 135a that aligns with the receptacle 135 in the distribution element 134. FIG. 8 shows the gas distribution insert assembled to the lid 115.

Referring now to FIGS. 10A-E and FIG. 11, an alternate embodiment of an ampoule 300 and a lid assembly 316 are shown. The ampoule 300 and the lid assembly 316 are suitable for use with semiconductor manufacturing raw materials, which include reagents and precursors. Not all of the details are repeated with respect to FIG. 1A, FIG. 2, FIG. 3A and FIG. 4, as the general construction of the ampoule 300 and the lid assembly 316 are generally similar to the ampoule 100 and the lid assembly 116 shown and described with respect to FIG. 1A, FIG. 2, FIG. 3A and FIG. 4. The details of the lid assembly 316 as shown with respect to FIG. 11 that are different from the lid assembly in FIG. 3A include the distribution element 334 fitting within the outlet plenum 332 instead of extending across the width or diameter of the container and covering the top surfaces of the walls 126a-d. Thus, the distribution element 134 is located only within the outlet plenum 332. Flow exiting the cavity 318 passes through the distribution element 334 prior to entering the outlet plenum 332. The distribution element 334 is held in place by a retaining element 337, which can be fastened to the lid by fasteners such as screws or bolts. Gas distribution insert 360 includes an orifice 362 therethrough, the orifice 362 sized and configured to increase the flow velocity of gas flowing into the ampoule. In one or more embodiments, there is a single orifice 362, but there can be any number of orifices, for example, one to twenty or one to six orifices, each orifice having a diameter in a range of from 0.01 mm to 10 mm, 0.01 to 1 mm, 0.2 mm to 0.9 mm, 0.2 to 0.8 mm, 0.3 mm to 0.7 mm to increase flow velocity of the carrier gas entering the ampoule.

The distribution element 334 may be any suitable material or configuration or dimensions or media grade offering one or more of the following characteristics: withstands long-term exposure to the precursor, does not introducing a pressure drop that would impede effective delivery of the precursor, pore size to inhibit and/or prevent fine particles and/or droplets of precursor from exiting the ampoule to protect both the inlet and outlet equipment, and pliable to be capable of making a slight seal between ends of the elongate walls and an inner diameter of the cavity. In one or more embodiments, the distribution element 334 is a porous disk of filter media. In one or more embodiments, the distribution element 334 is a sintered, porous stainless steel material. A non-limiting, exemplary porosity of the distribution element 334 may be greater than or equal to 0.1 micrometers to less than 100 micrometers, and all values and subranges therebetween, as measured by average pore size. The lid 315 shown in FIG. 11 further comprises complementary pins 319 extending from the peripheral rim of the lid 315. The lid assembly 316 shown in FIG. 11 further comprises a receptacle 335a to receive the gas distribution insert 360. A shim 333 is disposed between a lower surface of the lid 315 and top edges of the elongate walls 326a, 326b, 326c, and 326d. The shim 333 is a soft and compliant sheet of material, for example, a soft metal such as aluminum, or a pliable polymeric or elastomer material, for example, Teflon.

The ampoule 300 includes a container 310 with a bottom wall 312, sidewalls 314, and a lid assembly 316 including a lid 315. An inlet port 320 and outlet port 330 are in fluid communication with a cavity 313 defined by internal walls of the container 310. The inlet port 320 is generally configured to allow a connection to a gas source by way of suitable piping and valve(s) and may have suitable threaded or sealing connections. In one or more embodiments, the gas source is a carrier gas; in one or more embodiments, the carrier gas is inert. The outlet port 330 is also in fluid communication with the cavity 318. The outlet port 330 is generally configured to be able to connect to a line, including suitable piping and valve(s), to allow the flow of gases, which may include entrained particles, exiting the container 310 to flow to a processing chamber (or other component). The outlet port 330 may have a welded or threaded connection to allow a gas line to be connected. A height (H) of the cavity defined by the container 310 spans from a lower surface 316a of the lid assembly 316 to a top surface of the bottom wall 312, as shown in the previous embodiment.

The cavity 318 is made up of a plurality of flow channels 324a, 324b, 324c, 324d and 324e defined by a plurality of elongate walls 326a-126d. The elongate walls 326a, 326b, 326c and 326d each comprise a flow ingress opening as follows: ingress opening 328a of the wall 326a, ingress opening 328b of the wall 326b, ingress opening 328c of the wall 326c, and ingress opening 328d of the wall 326d. The flow ingress openings are offset such that not one ingress opening overlaps with another ingress opening.

The plurality of elongate walls 326a-326d at a bottom edge or rim reside in or mate with corresponding grooves in a lower surface of the lid assembly 316 (similar to the embodiment shown with respect to FIG. 3A). A plurality of grooves 313a-313d (only grooves 313b and 313c can be seen in FIG. 10A as grooves 313a and 313d are covered by precursor) aligned with the grooves in the lower surface of the lid are optionally present in a lower surface of the bottom wall 312. In the embodiment shown, the top edges of the elongate walls 326a-326 abut against the shim 333, which is sandwiched between the top edges of the elongate walls 326a-326d and the lid 315. In one or more embodiments, in an absence of the shim 333, the plurality of elongate walls 326a-326d at the top edge or rim can reside in or mate with the plurality of grooves optionally present in a lower surface of the lid assembly 316. The elongate walls 326a-326d span the height of the cavity extending into the bottom wall 312 and towards, and optionally into the lid 315. The elongate walls 326a-326d are effective to conduct heat from one or more external sources. In embodiments, the elongate walls are solid and are non-porous, permitting gas to flow through the elongate walls 326a-326d at the ingress openings.

A distribution element 334 is present as described above. The distribution element 334 is located between the cavity 318 and outlet plenum 332. That is, flow exiting the outlet plenum 332 passes through the distribution element 334 prior to exiting the cavity 318 through the outlet plenum 332

In some embodiments, the ampoule 300 includes a precursor 350, which in some embodiments is a low vapor pressure material within the cavity 318, residing in the flow channels defined by the elongate walls 326a-326d. Space above the material within the cavity 318 and below the lower surface 316a of the lid assembly is referred to as the head space of the ampoule 300. When present, the distribution element 334 resides in the head space of the ampoule. The precursor 350 can be a precursor for use with a semiconductor manufacturing process. In one or more embodiments, the material with a low vapor pressure is a liquid. In other embodiments, the material with a low vapor pressure is a solid.

In some embodiments, the lid assembly 316 is a separate component from the bottom wall 312 and sidewalls 314. The lid assembly 316 can be connected to the sidewalls 314 of the container 310 using removable bolts through appropriately shaped openings, which may have a threaded portion to allow for easy connection of a threaded bolt. The bolts can be removed to allow the lid assembly 316 to be removed from the container 310 so that the precursor 150 in the container 110 can be changed or added.

The lid 315 may further comprise one or more external surface features to reciprocate with an external heater. The bottom wall may be configured to reciprocate with an external heater. One or more jacket heaters may be provided around the sidewalls.

A first seal 352 is located between an upper surface of the sidewalls 314 and the lower surface 316a of the lid assembly 316 to form a fluid tight seal. In embodiments in which the bottom wall 312 is a separately formed element, a second seal is located between an upper portion of the bottom wall 312 and a lower surface of the sidewalls 314 to form a fluid tight seal. In the embodiment shown in FIG. 10A, the bottom wall 312 is integrally formed with the sidewalls 314, eliminating the need for a second seal. In some embodiments where the bottom wall 312 is a separately formed element, the first seal 352 and the second seal are independently an O-ring. In some embodiments (not shown), the lid assembly 316 can be integrally formed with the sidewalls 314 and the bottom wall 312 of the container 310.

Different manifold configurations can be connected to the lid assembly 316 to allow the ampoule 300 to be added to a process chamber. In some embodiments, an inlet line is connected to the inlet port 320 (similar to as shown in FIG. 1A). An inlet valve can be positioned on the inlet line between a gas source and the inlet port 320. The inlet valve can be integrally formed with the lid assembly 316 or connected to the lid assembly 316 as a separate component. An outlet line can be connected to the outlet port 330 (similar to as shown in FIG. 1A). The outlet line of some embodiments includes an outlet valve located between the outlet port 330 and a processing chamber. The inlet valve and outlet valve can be used to isolate the ampoule 300 so that the contents of the cavity 318 are isolated from the environment outside of the container 310. In some embodiments, there are multiple valves along the inlet line and/or the outlet line and/or therebetween (similar to as shown in FIG. 1A). The valves can be manual valves or pneumatic valves.

In one or more embodiments, the elongate walls 326a, 326b, 326c and 326d comprise elongate tubular walls, which define a series of flow channels 324a, 324b, 324c, 324d, and 324e. In one or more embodiments, the elongate walls 326a, 326b, 326c, and 326d are concentric and tubular. The relative location of the walls may be adjusted to, for example, favor depletion of the precursor in a desired matter. In one or more embodiments, annular distances between walls varies. The use of tubular elongate walls, fabricated by nesting readily available tubing facilitates assembly and reduces costs of the ampoules.

Figure 10A:
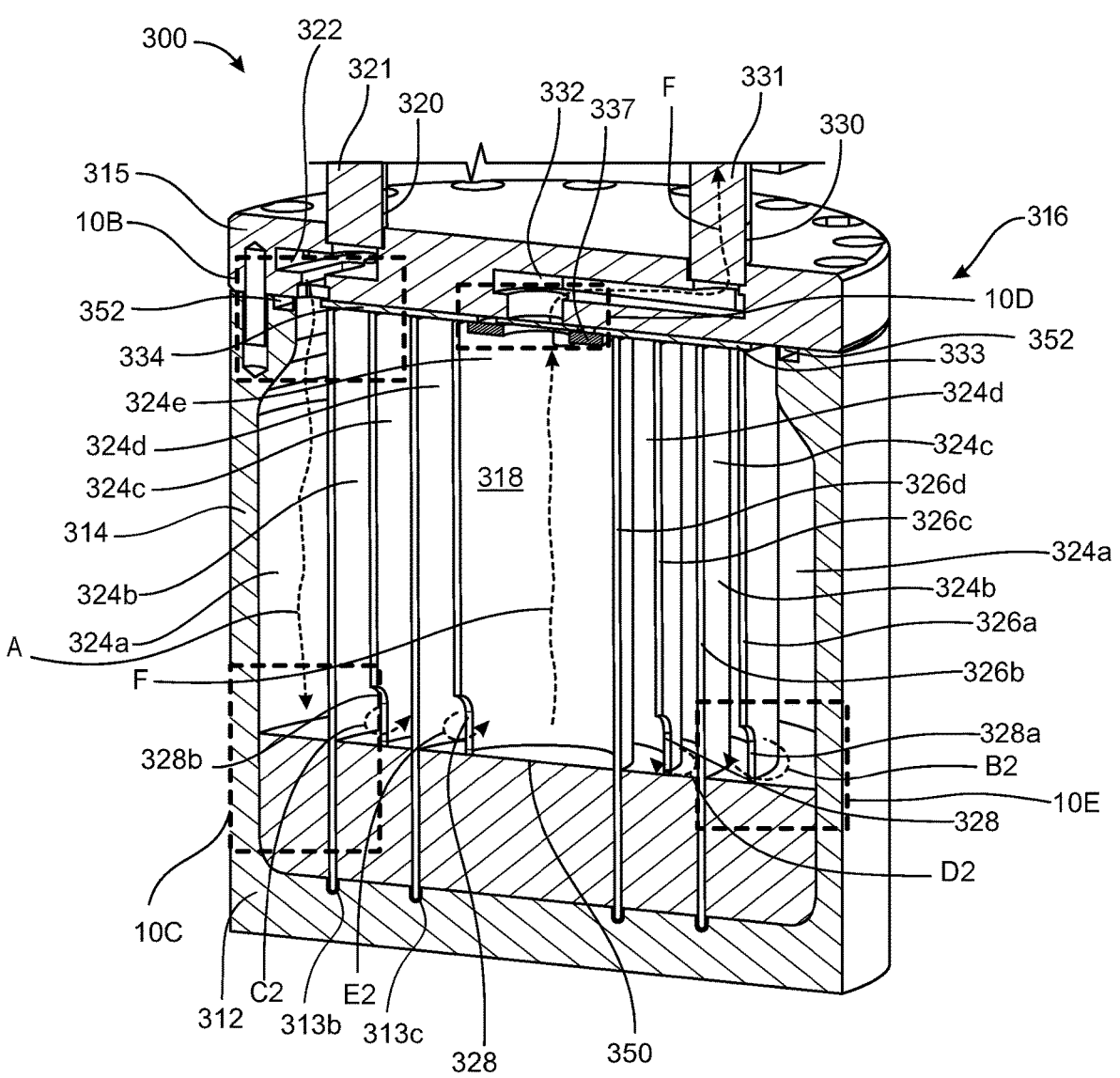
FIG. 10A is a cross-sectional view of the lid assembly shown in FIG. 11 and a container assembled together according to an alternative embodiment.
Figure 10B:
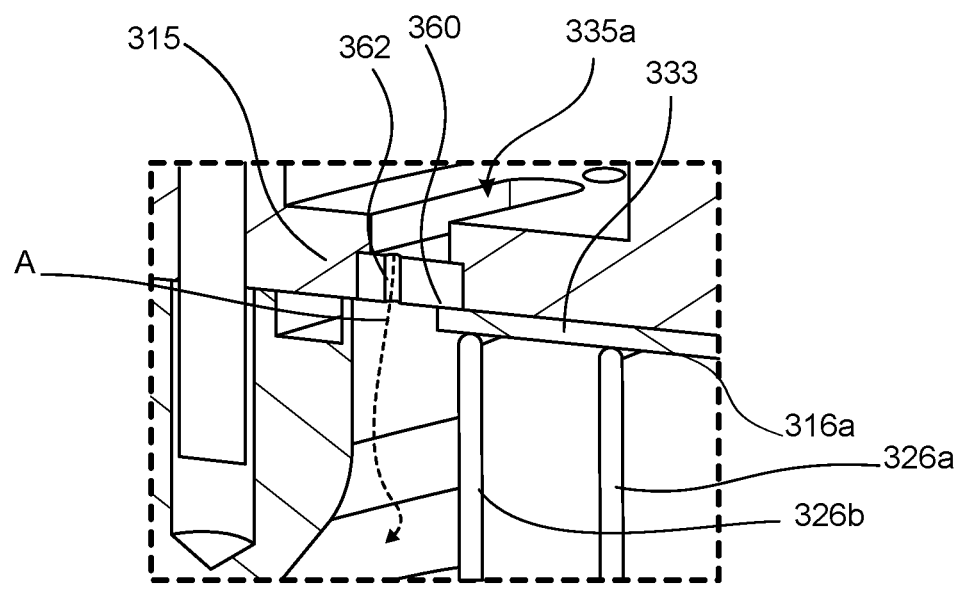
FIG. 10B is a partial cross-sectional view of section 10B in FIG. 10A.
Figure 10C:
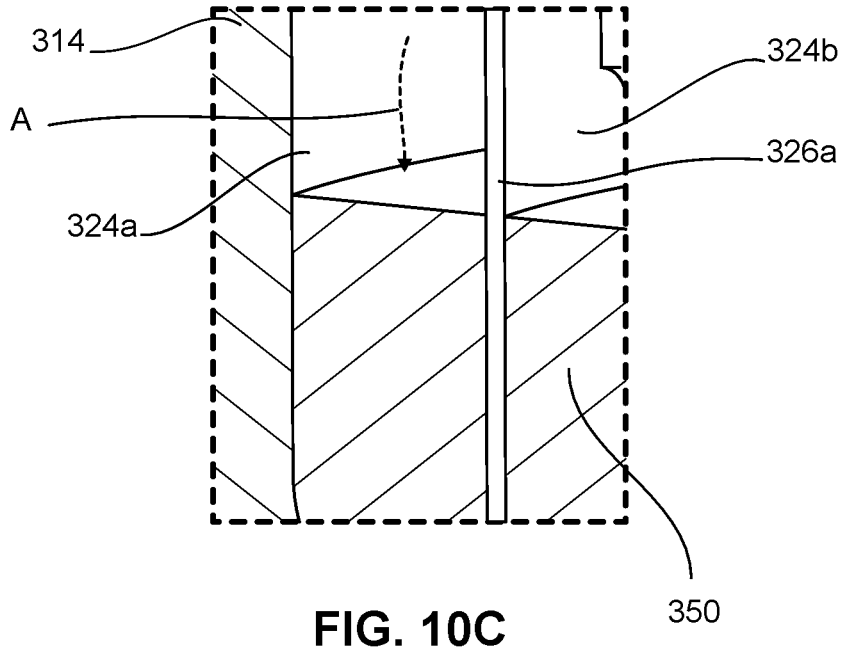
FIG. 10C is a partial cross-sectional view of section 10C in FIG. 10A.
Figure 10D:
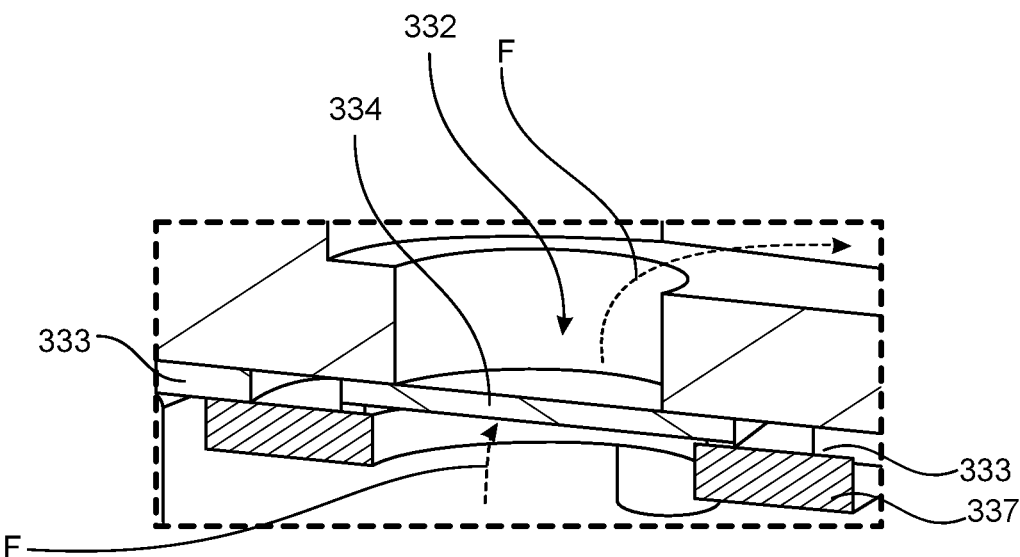
FIG. 10D is a partial cross-sectional view of section 10D in FIG. 10A.
Figure 10E:
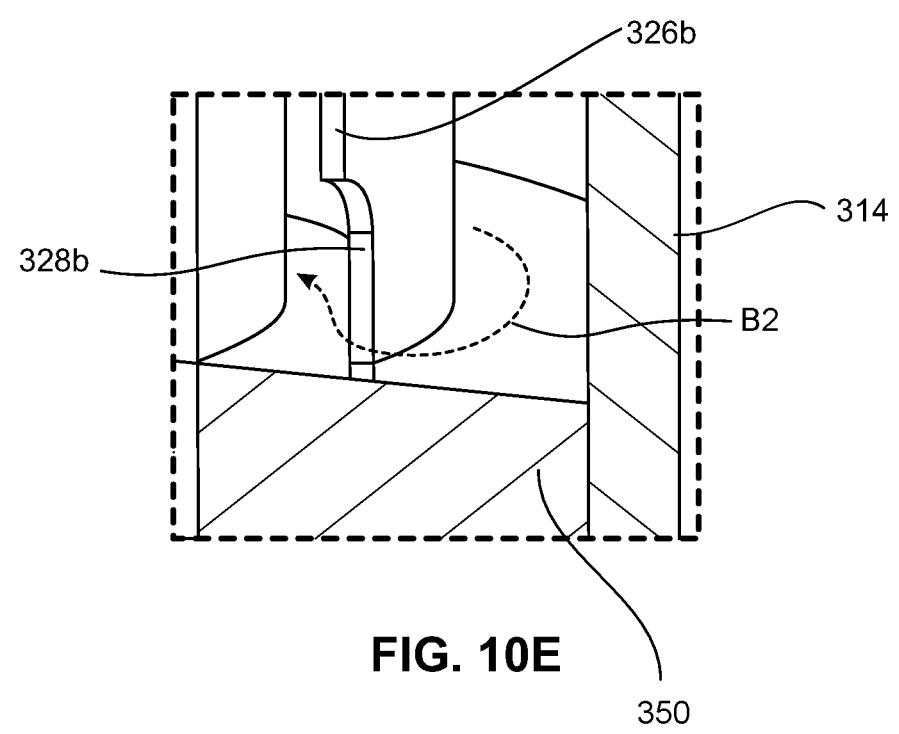
FIG. 10E is a partial cross-sectional view of section 10E in FIG. 10A.
Figure 11:
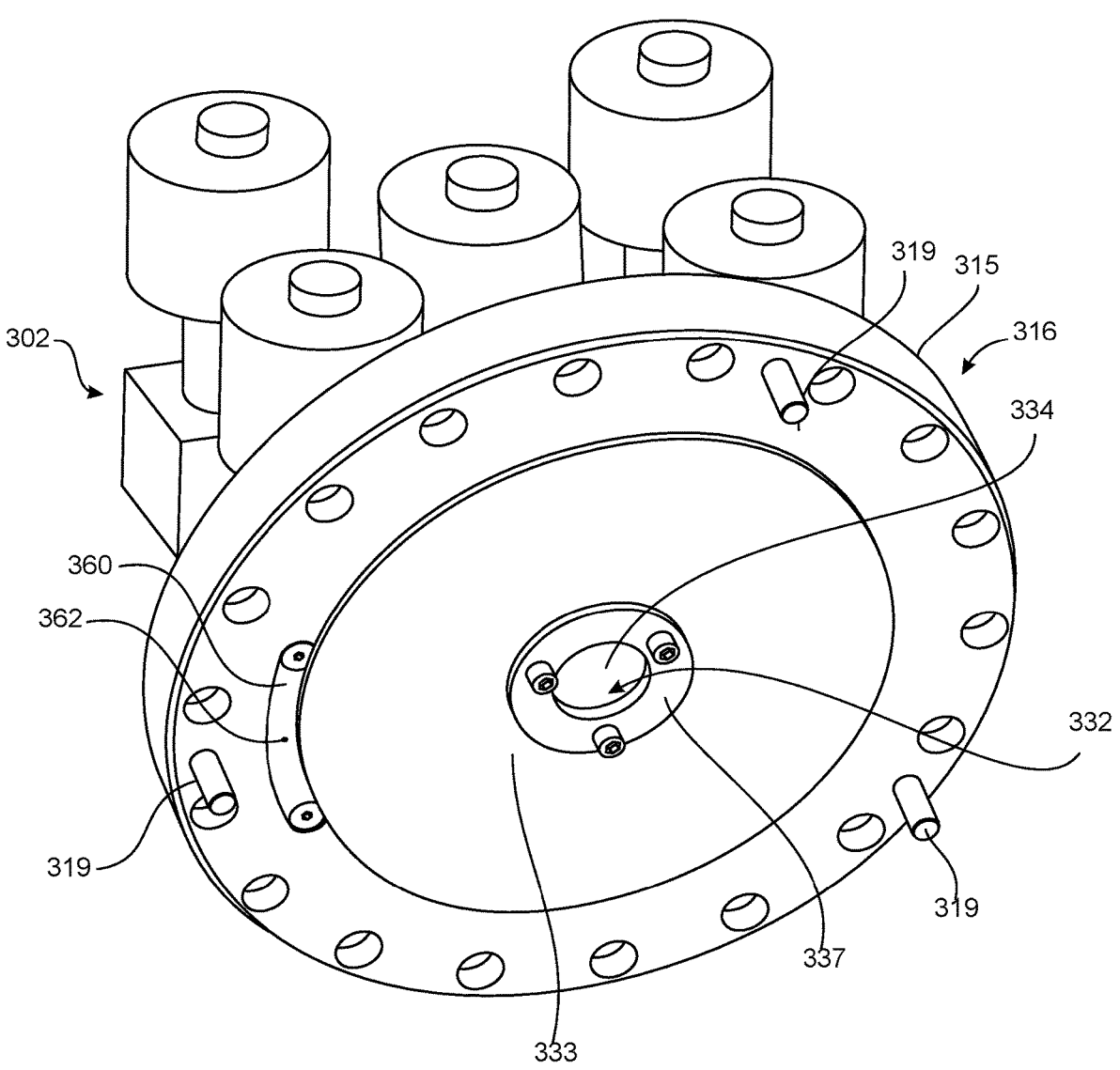
FIG. 11 is a bottom perspective view of a lid assembly for an ampoule according to an alternative embodiment.

Carrier gas flow enters the ampoule 300 from the inlet port 320 by way of the inlet plenum 322. The carrier gas, indicated by dashed arrow "A" in FIG. 10A, enters the flow channel 324a defined by the sidewalls 314 and the elongate wall 326a and contacts the precursor 350 at a high velocity after passing through the orifice 362, thereby entraining and/or vaporizing the precursor as the carrier gas passes over a surface of a volume of the precursor. Flow then proceeds through ingress opening 328a of elongate wall 326a, at which point the carrier gas enters flow channel 324b and the surface of elongate wall 326b opposite the flow ingress opening 328a directs the flow in two directions, depicted by arrows B1 and B2 (similar to as shown for the embodiment in FIG. 4; (arrow B2 is shown in FIG. 10A)) through the flow channel 324b. While in flow channel 324b, the carrier gas continues to contact the precursor 350 and become saturated. Similarly, flow then proceeds through ingress opening 328b of elongate wall 326b, at which point the carrier gas enters flow channel 324c and the surface of elongate wall 326c directs the flow in two directions, depicted by arrows C1 and C2 (similar to as shown for the embodiment in FIG. 4; (arrow C2 is shown in FIG. 10A)) through the flow channel 324c. While in flow channel 324c, the carrier gas continues to contact the precursor 350 and become saturated. Likewise, flow then proceeds through ingress opening 328c of elongate wall 326c, at which point the carrier gas enters flow channel 324d and the surface of elongate wall 326d directs the flow in two directions, depicted by arrows D1 and D2 (similar to as shown for the embodiment in FIG. 4; (arrow D2 is shown in FIG. 10A)) through the flow channel 324d. While in flow channel 324d, the carrier gas continues to contact the precursor 350 and become saturated. Finally, flow then proceeds through ingress opening 328d of elongate wall 326d, at which point the carrier gas enters flow channel 324e, depicted by dashed arrow F in FIG. 10A (similar to as depicted by arrows E1 and E2 for the embodiment in FIG. 4 (arrow E2 is shown in FIG. 10A)), and out of the ampoule through outlet plenum 332 and outlet port 330. While in flow channel 324e, the carrier gas continues to contact the precursor 350 and become saturated.

Accordingly, the flow channels 324a-324e are nested comprising a plurality of tortuous passages (324a, 324b, 324c, 324d) and an outlet flow channel or passage (324e), such that with respect to the tortuous passages, flow through a first ingress opening (328a, 328b, 328c) diverts the carrier gas into first and second portions each flowing in first and second directions (e.g., B1 and B2, C1 and C2, and D1 and D2) through first and second sections of the tortuous passages, respectively.

According to one or more embodiments, when the ampoule contains a minimum quantity of precursor, which may depend on the specific precursor in the ampoule and its physical properties, it is expected that the carrier gas will become fully saturated over the flow path distance. As the amount of precursor level in the ampoule decreases during service, the degree of saturation may decrease. Saturation may change as a function of fill level. It is understood that the presence of five flow channels as shown in the embodiments described herein is not limiting and that the number of channels may be chosen based on space constraints and/or precursor characteristics and/or design need.

In some embodiments, the gas flows through the inlet port 120 or 320 and along the flow path is sufficient to entrain and/or vaporize and/or sublime the precursor without a need for bubbling. The gas flow can be adjusted during processing as the level of precursor 150 or 350 decreases to maintain a sufficient contact. In one or more embodiments, the flow has a maximum velocity in combination with the heat sources sufficient to prevent condensation of the precursor 150 or 350 at the outlet port 130 or 330.

Thermocouples, mass flow meters, and pressure gauges may be included in the equipment denoted herein in order to monitor process conditions. In one or more embodiments, a mass flow meter is provided to monitor gas flow into the inlet port. In one or more embodiments, a thermocouple is installed in the lid assembly. In one or more embodiments, a pressure gauge is provided on the inlet line and/or the outlet line. A pressure range within the ampoule in accordance with some embodiments is greater than or equal to 25 torr to less than or equal to 150 torr.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An ampoule for a semiconductor manufacturing precursor, the ampoule comprising:
    a container defining a cavity configured to hold the precursor;
    an inlet port and an outlet port, both in fluid communication with the cavity;
    an inlet plenum located between the inlet port and the cavity;

an outlet plenum located between the outlet port and the cavity;

a plurality of elongate walls, each of the elongate walls having a top edge and a bottom edge defining a length and configured to contain the precursor, the plurality of elongate walls arranged to define flow channels, each of the elongate walls comprising a flow ingress opening;

a flow path defined by the flow channels and the flow ingress openings, through which a carrier gas flows in contact with the precursor; and a lid including a gas distribution insert assembled to the lid and comprising an orifice between the inlet port and the cavity, the orifice having a diameter in a range of from 0.2 mm to 0.9 mm and configured to increase a flow velocity of the carrier gas exiting the inlet plenum and flowing through the orifice into the cavity.

2. The ampoule of claim 1, wherein the plurality of elongate walls and ingress openings define a labyrinth such that the flow path is tortuous.

3. The ampoule of claim 1, wherein the flow ingress openings are offset such that not one ingress opening overlaps with another ingress opening.

4. The ampoule of claim 1, wherein the ampoule comprises a single inlet and a single outlet.

5. The ampoule of claim 1, further comprising a plurality of orifices, each of the plurality of orifices having a diameter in the range of from 0.2 mm to 0.9 mm and configured to increase the flow velocity of the carrier gas exiting the inlet plenum and flowing through each orifice into the cavity.

6. The ampoule of claim 1, further comprising a porous distribution element fitted only within the outlet plenum, the porous distribution element having an average pore size in a range of from 0.1 micrometers to 100 micrometers.

7. The ampoule of claim 1, wherein the plurality of elongate walls comprise a solid, non-porous material.

8. The ampoule of claim 6, further comprising a retaining element fastened to the lid and configured to hold the porous distribution element to the lid.

9. An ampoule for dispensing a vapor mixture of a carrier gas and a low vapor pressure precursor used in semiconductor manufacturing, the ampoule comprising:

a container having a bottom wall, sidewalls, and a lid assembly, the container defining a cavity configured to hold the precursor, such that a height (H) of the cavity spans from a lower surface of the lid assembly to a top surface of the bottom wall;

a single inlet port and a single outlet port, both in fluid communication with the cavity;

an inlet plenum located between the single inlet port and the cavity;

an outlet plenum located between the single outlet port and the cavity;

a plurality of elongate tubular walls configured to contain the precursor and arranged to define flow channels, each of the elongate tubular walls having a top edge and a bottom edge defining a length, each of the elongate tubular walls comprising a flow ingress opening extending from the bottom edge, the flow ingress openings being offset such that not one ingress opening overlaps with another ingress opening;

a lid including a gas distribution insert assembled to the lid and including one to six orifices, each orifice having a diameter in a range of from 0.2 mm to 0.9 mm and configured to increase a flow velocity of the carrier gas exiting the inlet plenum and flowing through each orifice into the cavity; and a tortuous flow path defined by the flow channels and the flow ingress openings, through which the carrier gas flows in contact with the precursor.

10. The ampoule of claim 9, further comprising a porous distribution element fitted within only the outlet plenum.

11. The ampoule of claim 10, wherein the porous distribution element has an average pore size in a range of from 0.1 micrometers to 100 micrometers.

12. The ampoule of claim 9, wherein the plurality of elongate tubular walls are concentric and made from a solid, non-porous material.

13. The ampoule of claim 9, wherein the bottom wall comprises a plurality of grooves that mate with the plurality of elongate tubular walls.

14. The ampoule of claim 12, wherein the inlet plenum is configured to direct a gas into an outermost flow channel of the flow channels and the gas exits an innermost flow channel of the flow channels through the outlet plenum.

15. The ampoule of claim 9, wherein each orifice has a diameter in a range of from 0.3 mm to 0.7 mm.

16. The ampoule of claim 9, wherein the flow channels are nested, the flow channels comprising a plurality of tortuous passages and an outlet passage, such that flowing the carrier gas through a first ingress opening diverts the carrier gas into first and second portions, each flowing in first and second directions through first and second sections of the tortuous passages, respectively.

17. A method of providing a flow of precursor in a substrate processing chamber during a vapor deposition process to form a film on a substrate, the method comprising:

flowing a carrier gas through the inlet port and the inlet plenum of the ampoule of claim 1 having a low vapor pressure precursor therein;

directing the flow of the carrier gas within the ampoule and in contact with the precursor through the flow path defined by the flow channels and the flow ingress openings in the elongate walls, through which the carrier gas flows in contact with the precursor, the flow ingress openings extending from the bottom edge of each of the plurality elongate walls; and flowing the carrier gas and precursor out of the ampoule through the outlet plenum and the outlet port into the substrate processing chamber.

18. The method of claim 17, further comprising directing the flow of the carrier gas through the orifice configured to increase the flow velocity of the carrier gas contacting the precursor.

19. The method of claim 17 further comprising independently heating a lid assembly and a bottom wall of the ampoule, the plurality of elongate walls being effective to conduct heat from an external heat source.

20. The method of claim 17, wherein the flow path comprises nested passages such that flowing the carrier gas through a first ingress opening diverts the carrier gas into first and second portions, each flowing in first and second directions through first and second sections of the passages, respectively.

* * * * *